(12) United States Patent
Wilson et al.

(10) Patent No.: US 7,521,972 B2
(45) Date of Patent: Apr. 21, 2009

(54) FIFTY PERCENT DUTY CYCLE CLOCK DIVIDER CIRCUIT AND METHOD

(75) Inventors: Christopher Wilson, Ft. Collins, CO (US); Daniel Alan Berkram, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 13 days.

(21) Appl. No.: 11/903,950

(22) Filed: Sep. 25, 2007

(65) Prior Publication Data

US 2009/0079473 A1   Mar. 26, 2009

(51) Int. Cl.
*H03K 21/00* (2006.01)
*H03K 23/00* (2006.01)
*H03K 25/00* (2006.01)

(52) U.S. Cl. ..................................... 327/115
(58) Field of Classification Search ................ 327/115; 377/47, 48
See application file for complete search history.

(56) References Cited

U.S. PATENT DOCUMENTS

| | | | |
|---|---|---|---|
| 4,366,394 A | 12/1982 | Clendening et al. | |
| 4,891,825 A * | 1/1990 | Hansen | 377/52 |
| 5,371,772 A * | 12/1994 | Al-Khairi | 377/47 |
| 5,477,181 A | 12/1995 | Li et al. | |
| 5,914,996 A * | 6/1999 | Huang | 377/39 |
| 6,018,258 A | 1/2000 | Kang | |
| 6,121,801 A | 9/2000 | Lee | |
| 6,313,673 B1 * | 11/2001 | Watanabe | 327/115 |
| 6,404,839 B1 * | 6/2002 | Fong et al. | 377/47 |
| 6,489,817 B1 | 12/2002 | Wong et al. | |
| 6,566,918 B1 | 5/2003 | Nguyen | |
| 6,617,893 B1 | 9/2003 | Born et al. | |
| 6,707,326 B1 * | 3/2004 | Magoon et al. | 327/115 |
| 6,807,552 B2 * | 10/2004 | Bredin et al. | 708/103 |
| 6,847,239 B2 * | 1/2005 | Leifso et al. | 327/117 |
| 6,882,189 B2 * | 4/2005 | Tam et al. | 327/115 |
| 6,956,793 B2 * | 10/2005 | Ngo | 368/156 |
| 6,970,025 B2 * | 11/2005 | Magoon et al. | 327/115 |
| 7,049,864 B2 * | 5/2006 | Kelkar et al. | 327/115 |
| 7,113,009 B2 * | 9/2006 | Sun et al. | 327/115 |
| 7,187,216 B2 * | 3/2007 | Sun et al. | 327/115 |
| 7,209,534 B2 | 4/2007 | Lewis | |
| 7,358,782 B2 * | 4/2008 | Khanoyan et al. | 327/117 |
| 7,405,601 B2 * | 7/2008 | Garlapati et al. | 327/115 |
| 7,444,534 B2 * | 10/2008 | Panchal | 713/500 |
| 2002/0125923 A1 * | 9/2002 | Chang et al. | 327/115 |
| 2003/0193355 A1 * | 10/2003 | Leifso et al. | 327/115 |
| 2004/0160247 A1 * | 8/2004 | Magoon et al. | 327/115 |
| 2007/0152720 A1 | 7/2007 | Koh | |
| 2008/0204088 A1 * | 8/2008 | Garlapati et al. | 327/115 |

* cited by examiner

*Primary Examiner*—Donovan Lincoln
*Assistant Examiner*—Adam D Houston

(57) ABSTRACT

In one embodiment, a clock divider for producing a signal having a fifty percent duty cycle includes signal modifier circuitry connected to provide a variable clock signal. Responsive to first and second control signals of the signal modifier circuitry having respective first values, the signal modifier circuitry modifies a differential clock signal that includes first and second complementary clock signals to produce the variable clock signal, which contains an extended clock phase in every $I^{th}$ cycle, I being an integer. The clock divider also contains counting circuitry connected to change the value of an output signal each time I cycles of the variable clock signal are counted.

20 Claims, 4 Drawing Sheets

FIFTY PERCENT DUTY CYCLE CLOCK DIVIDER CIRCUIT AND METHOD

CROSS-REFERENCE TO RELATED APPLICATION(S)

This application discloses subject matter related to the subject matter disclosed in the following commonly owned co-pending patent application: "RATIO GRANULARITY CLOCK DIVIDER CIRCUIT AND METHOD," filed Sep. 25, 2007; application Ser. No. 11/903,948, in the name(s) of: Christopher Wilson and Daniel Alan Berkram, which is incorporated by reference herein.

BACKGROUND

Electronic circuits that divide the frequency of an input clock signal and create an output clock signal with a lower frequency are generally called clock dividers. Clock dividers may be used in a number of applications; at least some of these applications require the output signal to have a fifty percent duty cycle in which the duration of the pulse is half the pulse period. An output signal with a fifty percent duty cycle is generally easier to produce when the input clock is divided by an even integer rather than by an odd integer. A clock divider that is able to provide more flexibility in the choice of divisors may result in a greater ability to reuse existing components in new circuits.

DETAILED DESCRIPTION OF THE DRAWINGS

Figure 1:
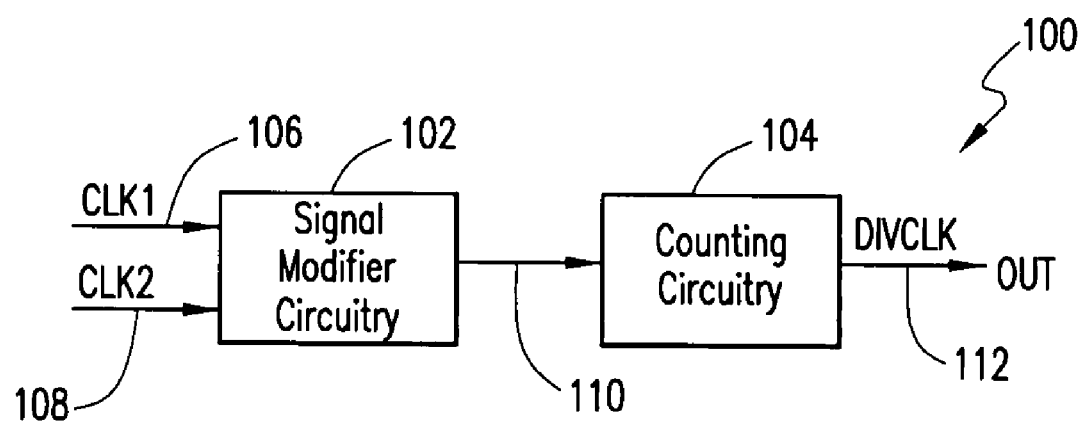
FIG. 1 illustrates a high-level diagram of a clock divider operable to produce a signal having a fifty percent duty cycle in accordance with an embodiment of the present disclosure.

Representative embodiments of the present patent disclosure will now be described with reference to various examples wherein like reference numerals are used throughout the description and several views of the drawings to indicate like or corresponding parts, and further wherein the various elements are not necessarily drawn to scale.

With reference to FIG. 1, a clock divider 100 connected to produce a signal having a fifty percent duty cycle is illustrated according to an embodiment of the present disclosure. Clock divider 100 may be visualized here as two circuit portions—signal modifier circuitry 102 and counting circuitry 104.

As illustrated, signal modifier circuitry 102 may receive complementary clock signals CLK1 106 and CLK2 108, which form a differential clock signal, and may output variable clock signal 110. Variable clock signal 110 can preferably be produced in one of two ways. In at least some uses of clock divider 100, signal modifier circuitry 102 can modify CLK1 106 and CLK2 108 before these signals are sent to counting circuitry 104, lengthening one phase of the signal in every $I^{th}$ cycle of CLK1 106 and CLK2 108, I being an integer.

In other uses of clock divider 100, signal modifier circuitry 102 may pass through at least one of CLK1 106, CLK2 108 without modification to form variable clock signal 110. The differential clock signal may be modified or passed through unmodified depending on whether it is desirable to divide the input clock by an odd or even number. In at least some embodiments, variable clock signal 110 and divided clock signal DIVCLK 112 may each be composed of two complementary signals, in the same manner that the differential input clock is composed of CLK1 106 and CLK2 108.

Counting circuitry 104 may include an architecture that receives an input clock signal, such as variable clock signal 110, and produces a divided clock signal, such as DIVCLK 112, which has a fifty percent duty cycle. Counting circuitry 104 may operate, for example, by repeatedly counting cycles of variable clock signal 110. Each time circuitry 104 counts I cycles, the value of output signal DIVCLK 112 is switched, either from high to low or from low to high. In this manner, one phase, i.e., one half of a cycle of DIVCLK 112, is produced each time counting circuitry 104 counts I cycles. When variable clock signal 110 is the same as CLK1 106 or CLK2 108, i.e., all phases of variable clock signal 110 have the same duration, the frequency of DIVCLK 112 may be the same as the frequency of CLK1 or CLK2 divided by 2I. When CLK1/CLK2 have been modified to form variable clock signal 110, i.e., one pulse in every I cycles is elongated, the frequency of DIVCLK 112 may be the same as the frequency of CLK1 or CLK2 divided by (2I+1).

To divide differential clock signals CLK1 106, CLK2 108 by a number N=3, for example, I may be equal to 1, i.e., N=(2I+1). Signal modifier circuitry 102 can initially select one of complementary clock signals, i.e., CLK1 and CLK2, and can provide the signal to counting circuitry 104 as variable clock signal 110. In at least some embodiments, the selection of CLK1 or CLK2 may be performed with a multiplexer. In this example, counting circuitry 104 will count one cycle of variable clock signal 110 and switch the value of DIVCLK 112. At about the same time, signal modification circuitry 102 will switch the source clock (CLK1 or CLK2) that is used to create variable signal 110. Switching the source clock used in signal modifier circuitry 102 effectively drops a phase from variable clock signal 110 so that counting circuitry 104 will be delayed by one-half cycle. Although counting circuitry 104 counts to one to create each phase of DIVCLK 112, the circuit will take one and one-half cycles to perform the count. In producing a full cycle of DIVCLK 112, counting circuitry 104 is delayed by two phases or a full cycle, effectively dividing by three. Special care may advantageously be taken to ensure that switching between complementary clock signals CLK1 and CLK2 does not cause a glitch to occur in variable clock signal 110.

Figure 2:
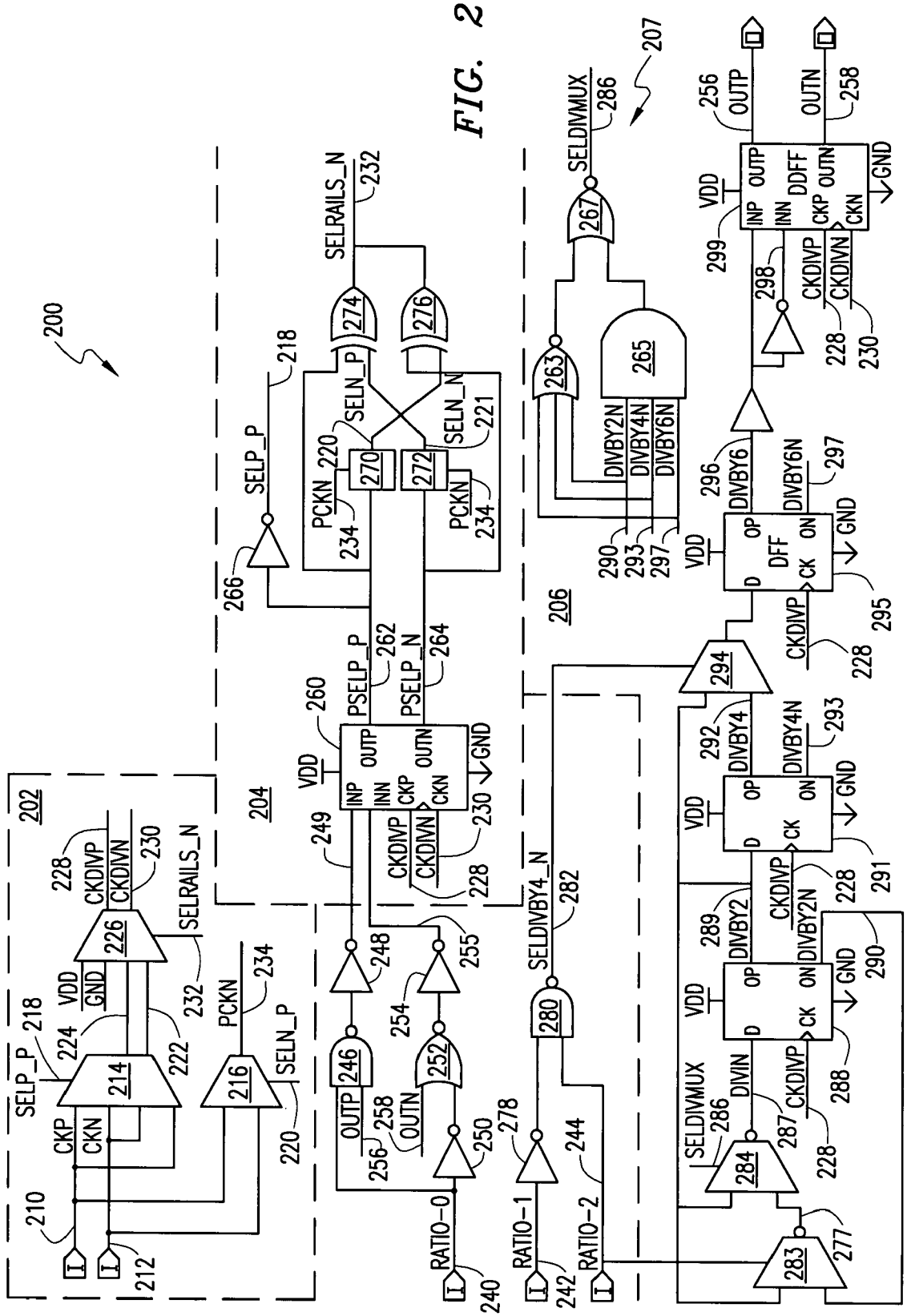
FIG. 2 depicts a circuit diagram of a clock divider that produces a signal having a fifty percent duty cycle according to an illustrative embodiment of the present disclosure.
Figure 3:
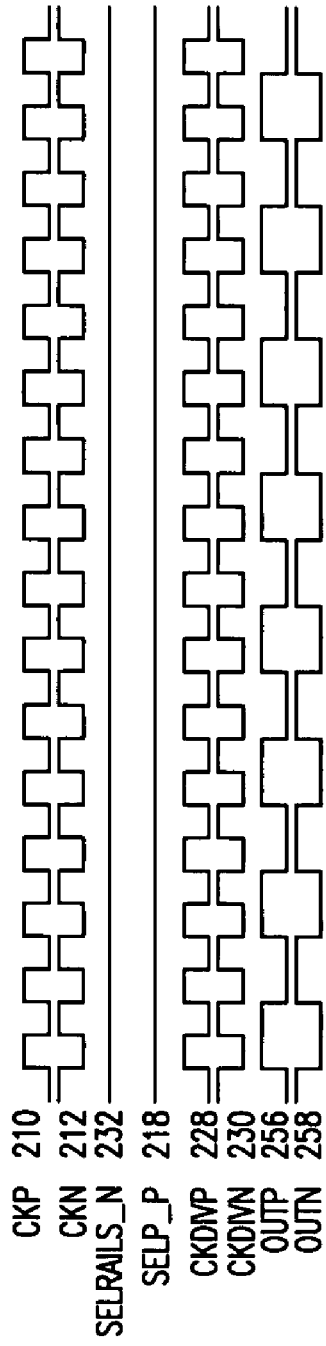
FIG. 3 illustrates a timing diagram associated with the embodiment of FIG. 2 in which an even divisor is selected.
Figure 4:
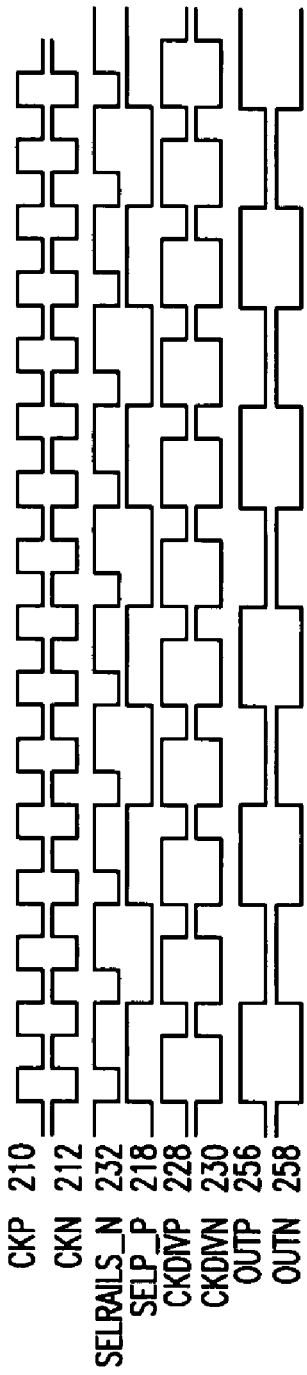
FIG. 4 illustrates a timing diagram associated with the embodiment of FIG. 2 in which an odd divisor is selected.

FIG. 2 depicts a circuit diagram of a clock divider 200 for producing a signal having a fifty percent duty cycle according to an embodiment of the present disclosure. Clock divider 200 can best be understood in conjunction with the timing signals produced by the circuit, so the drawing will be discussed with reference to FIGS. 3 and 4, which depict exemplary timing diagrams associated with circuit 200. FIG. 3 illustrates an embodiment in which clock divider 200 has been configured to divide the frequency by two, while FIG. 4 illustrates an embodiment in which clock divider 200 has been configured to divide the frequency by three. In the illustrated circuit embodiment of FIG. 2, not only is the input signal a differential clock signal composed of complementary clock signals CKP 210 and CKN 212, but the output signal is also a differential clock signal composed of complementary signals 256, 258. Additionally, variable clock signal 110

(shown in FIG. 1) is represented here by complementary signals CKDIVP 228, CKDIVN 230.

The number N by which the frequency of input signals 210, 212 is to be divided may be determined by the values of RATIO-0 238, RATIO-1 240, and RATIO-2 242. RATIO-1 240 and RATIO-2 242 may be provided to counter 206, where their values may determine the divisor value used by counter 206. RATIO-0 238 may be provided to state machine 204, where the value of RATIO-0 may determine the values of control signals SELP_P 218 and SELRAILS_N 232, which in turn determines whether the input clock signal is passed through unmodified to divide the frequency by an even number or has a phase extended in each $I^{th}$ cycle to divide the frequency by an odd number, as will be explained in greater detail hereinbelow.

In the embodiment of FIG. 2, clock divider 200 will be discussed with regard to three regions of the circuit: signal modification circuitry 202, state machine 204, and counter 206. One of ordinary skill in the art will recognize that although these areas are treated as discrete parts of the circuit, other embodiments of the circuit may combine the components in other groupings realized in different logic blocks to accomplish the same results without going outside the scope of the disclosure. Counter 206 may generally corresponds to counting circuitry 104 of FIG. 1, while signal modification circuitry 202 and state machine 204 may generally correspond to signal modifier circuitry 102 of FIG. 1.

Signal modification circuitry 202 may selectively modify the differential clock inputs CKP 210, CKN 212 to form variable clock signal CKDIVP 328, CKDIVN 230. In this embodiment, differential clock signals CKP 210 and CKN 212 are complementary signals, as seen in FIGS. 3 and 4, such that when CKP is high, CKN is low and when CKP is low, CKN is high. MUX 214 is connected to receive each of CKP 210 and CKN 212 at two separate inputs and produces intermediate clock signals 222, 224, each of which can be derived from CKP or CKN as selected by control signal SELP_P 218. When control signal SELP_P has a first value, e.g., 0, signal 224 can be derived from CKP and signal 222 can be derived from CKN; when control signal SELP_P has a second value, e.g., 1, signal 224 can be derived from CKN and signal 222 can be derived from CKP. MUX 226 receives intermediate clock signals 222, 224 and the voltage rails, e.g., VDD relative to ground GND, and provides complementary signals CKDIVP 228 and CKDIVN 230. In a first mode, e.g., when control signal SELRAILS_N 232 has a value of 1, MUX 226 derives CKDIVP 228 from intermediate clock signal 224 and derives CKDIVN 230 from intermediate clock signal 222. In a second mode, e.g., when control signal SELRAILS_N 232 has a value of 0, MUX 226 derives CKDIVP 228 from VDD and derives CKDIVN 230 from GND. Advantageously, MUX 226 may be used to hold CKDIVP 228 and CKDIVN 230 to VDD and GND respectively during the phase in which MUX 214 switches source clocks. Inputs CKP 210, CKN 212 are also received at MUX 216, which selects between CKP, CKN responsive to SELN_P 220 to provide output signal PCKN 234.

When clock divider 200 is acting to divide the input frequency by an even number, e.g., 2, as illustrated in FIG. 3, control signals SELP_P 218 and SELRAILS_N 232 each remain at a constant value, e.g., both equal to 1, as will be discussed hereinbelow. Holding SELP_P 218 constant may cause CKP 210 and CKN 212 to be passed through MUXs 214, 216 without modification. Holding SELRAILS_N 232 at a constant value of 1 may cause intermediate clock signals 222, 224 to be passed through MUX 226 unchanged, producing signals CKDIVP 228 and CKDIVN 230 as reproductions of input signals CKP 210, CKN 212 as seen in FIG. 3.

In contrast, when clock divider 200 is active to divide the input frequency by an odd number, e.g., 3, as illustrated in FIG. 4, control signals SELP_P 218 and SELRAILS_N 232 contain regular pulses that change the inputs used by MUXs 214, 216, 226. Each switch-over by MUX 214 may effectively remove a phase from intermediate clock signals 222, 224. Expressed in another way, each switch-over may extend a clock phase of intermediate clock signals 222, 224. At the time MUX 214 switches source clocks, a glitch may be introduced in intermediate clock signals 222, 224 because the switch occurs near a phase shift. To prevent a glitch from occurring in the signal provided to counter 206, intermediate clock signals 222, 224 are provided to MUX 226. Signal SELRAILS_N 232 is active low for one phase whenever signal SELP_P 218 changes, causing CKDIVP 228 and CKDIVN 230 to be derived from VDD and GND respectively. The resulting signals CKDIVP 228, CKDIVN 230 contain an extended phase in every I cycles, with no glitches, as seen in FIG. 4.

State machine 204 of clock divider 200 in FIG. 2 can advantageously produce control signals SELP_P 218, SELN_P 220 and SELRAILS_N 232, which are used to control MUXs 214, 216, 226. State machine 204 may receive signals 249, 255, which are derived as follows. NAND gate 246 combines signals RATIO-0 240 and OUTP 256, the latter of which is one of the output signals from counter 206. The output of NAND gate 246 may be inverted by inverter 248 to provide signal 249 as a first data input to differential D-flip-flop 260. Similarly, NOR gate 252 combines signals OUTN 258 and the inverse of RATIO-0 240 (by inverter 250). The output of NOR gate 252 may be inverted by inverter 254 to provide signal 255 as a second data input of differential D-flip-flop 260. Differential D-flip-flop 260 can be clocked by CKDIVP 228 and CKDIVN 230 and produce two complementary output signals PSELP_P 262 and PSELP_N 264. Signals PSELP_P 262 and PSELP_N 264 are captured by latches 270, 272 respectively, each of the latches being controlled by signal PCKN 234, produced in signal modification circuitry 202. The output 220 from latch 270 is connected to XOR gate 276, where the value is combined with PSELP_N 264. Likewise, the output 221 from latch 272 is connected to XOR gate 274, where the value is combined with PSELP_P 262. The outputs of XOR gates 274, 276 are provided as control signal SELRAILS_N 232. In addition, signal PSELP_P 262 is inverted at 266 to create control signal SELP_P 218.

When clock divider 200 is set to divide by an even number, e.g., 2 in FIG. 3, RATIO-0 may be set to zero, with the result that D-flip-flop 260 receives a constant value of zero on signal 249 and a constant value of one on signal 255. These constant values propagate through state machine 204, resulting in control signals SELP_P 218 and SELRAILS_N 232 each having the constant value of 1, as shown in FIG. 3. When SELP_P 218, SELN_P 220 and SELRAILS_N 232 are received in signal modification circuitry 204, they operate such that MUXs 214, 216, 226 do not switch inputs and signals CKP 210, CKN 212 are passed through signal modification circuitry 202 without modification.

When clock divider 200 is set to divide by an odd number, e.g., 3 as exemplified in FIG. 4, RATIO-0 may be set to 1, which allows an inverted version of OUTP 256 to be output from NAND gate 246 and allows an inverted version of OUTN 258 to be output from NOR gate 252. Since the outputs of NAND gate 246 and NOR gate 252 are immediately inverted again, the values of OUTP 256 and OUTN 258 may be received at D-flip-flop 260 as data inputs 249, 255. Of the outputs from differential D-flip-flop, signal PSELP_P 262 is inverted to form control signal SELP_P 218, which changes phase every three phases of CKP 210 and CKN 212, as shown in FIG. 4. When signals PSELP_P 262 and PSELP_N 264 are received by latches 270, 272 and XOR gates 274, 276, the combined output of XOR gates 274, 276 forms signal SELRAILS_N 232, which in this example is active low once every three phases of CKP 210 as shown in FIG. 4. The exemplary values shown on SELP_P 218 can cause MUXs 214, 216 to switch inputs every 3 phases and the value of SELRAILS_N 232 can cause MUX 226 to hold output signals CKDIVP 228, CKDIVN 230 to the rails during the phase when MUX 214 switches.

Continuing to refer to clock divider 200 of FIG. 2, counter 206 may receive control signal RATIO-1 242 and control SELDIVBY4_N 282; the latter is produced as an output of NAND gate 280 that receives RATIO-2 and the inverse of RATIO-1. These control signals determine the number I to which counter 206 counts before switching. In the specific embodiment of FIG. 2, counter 206 may divide the variable clock signal by 2, 4, or 6, although one skilled in the art will recognize that circuits to create other combinations of divisors can also be used. When the signal modification circuitry is enabled to extend a phase in the $I^{th}$ cycle, counter 206 effectively takes an extra cycle to count to a designated number, providing division by 3, 5, and 7. Counter 206 may contain circuitry that utilizes flip-flops and a feedback loop with inversion. In the implementation shown, counter 206 includes D-flip-flops 288, 291, 295 and differential D-flip-flop 299. D-flip-flops 288, 291, 295 are each clocked by variable clock signal CKDIVP 228 and differential D-flip-flop 299 is clocked by CKDIVP 228 and CKDIVN 230. MUX 283 is controlled by the value of input RATIO-2 244 and receives as inputs the output signal DIVBY2 289 and DIVBY2N 290 from D-flip-flop 288. MUX 283 is operable to invert the selected signal to produce signal 277. Both signal 277 and DIVBY2 289 are received by MUX 284 and selected using SELDIVMUX 286, which is produced in circuit portion 207. MUX 284 inverts the output to produce signal DIVIN 287, which is provided as data to D-flip-flop 288. Output DIVBY2 289 of D-flip-flop 288 is supplied to D-flip-flop 291, which in turn provides outputs DIVBY4 292 and DIVBY4N 293. DIVBY2 289 and DIVBY4 292 are both input to MUX 294, which is selected by signal SELDIVBY4_N 282. The output of MUX 294 is provided to D-flip-flop 295, which outputs signals DIVBY6 296 and DIVBY6N 297. Output DIVBY6 296 and its inverse 298 are provided to differential D-flip-flop 299, which produces the output signals for clock divider 200, i.e., OUTP 256 and OUTN 258. The signals DIVBY2N 290, DIVBY4N 293, and DIVBY6N 297 are used in circuit portion 207, where these signals are input to both NOR gate 263 and AND gate 265. The outputs from NOR gate 263 and AND gate 265 are combined in NOR gate 267 to produce signal SELDIVMUX 286, which is used as a select control signal with respect to MUX 284.

Counter 206 may operate in a manner in which counter 206 effectively counts to a number I and then switches the value of the output signals OUTP 256 and OUTN 258. Since counter 206 requires at least one clock cycle of input CKDIVP to produce a phase (or half of a cycle) of output clock OUTP 256, OUTN 258, counter 206 in conventional usage divides the input signal by an even number. As exemplified in FIG. 3, in which clock divider 200 divides the frequency by 2, at the end of each cycle of CKDIVP 228, the phase of OUTP 256 changes; at the end of each cycle of CKDIVN, the phase of OUTN 258 changes. In order to divide by an odd number, the input signal to counter 206 is modified, while the nature of counter 206 maintains the fifty percent duty cycle. As exemplified in FIG. 4, illustrating division by 3, in each cycle of CKDIVP 228, one phase has been extended to twice the usual length. Thus, although counter 206 "sees" only one cycle of CKDIVP 228, one and a half cycles of input signal CKP 210 will elapse while producing a phase of OUTP, OUTN. In other words, three cycles will elapse to produce a cycle of OUTP or OUTN. Thus, OUTP 256 and OUTN 258 have a frequency that is one-third the frequency of complementary clock signals CKP 210, CKN 212 while maintaining a fifty percent duty cycle. It can be seen that signal modification circuitry 202 and associated state machine 204 may be treated as phase extension circuitry that can be added to any known or heretofore unknown clock divider circuitry that is capable of dividing a clock frequency by an even number to produce a fifty percent duty cycle. The addition of the phase extension circuitry can provide the capability to also divide the clock frequency by an odd number while preserving the fifty percent duty cycle.

Accordingly, it can be seen that the circuit portions described hereinabove are operable, at least in part, as means for providing a variable clock signal, wherein in a first mode, the means for providing the variable clock signal modifies two complementary clock signals to create the variable clock signal, the variable clock signal having a phase in every $I^{th}$ cycle that is extended for two phases (i.e., one cycle), I being an integer; means for changing the value of an output signal each time I cycles of the variable clock signal are counted; and means for producing first and second control signals used by the means for providing the variable clock signal.

Figure 5:
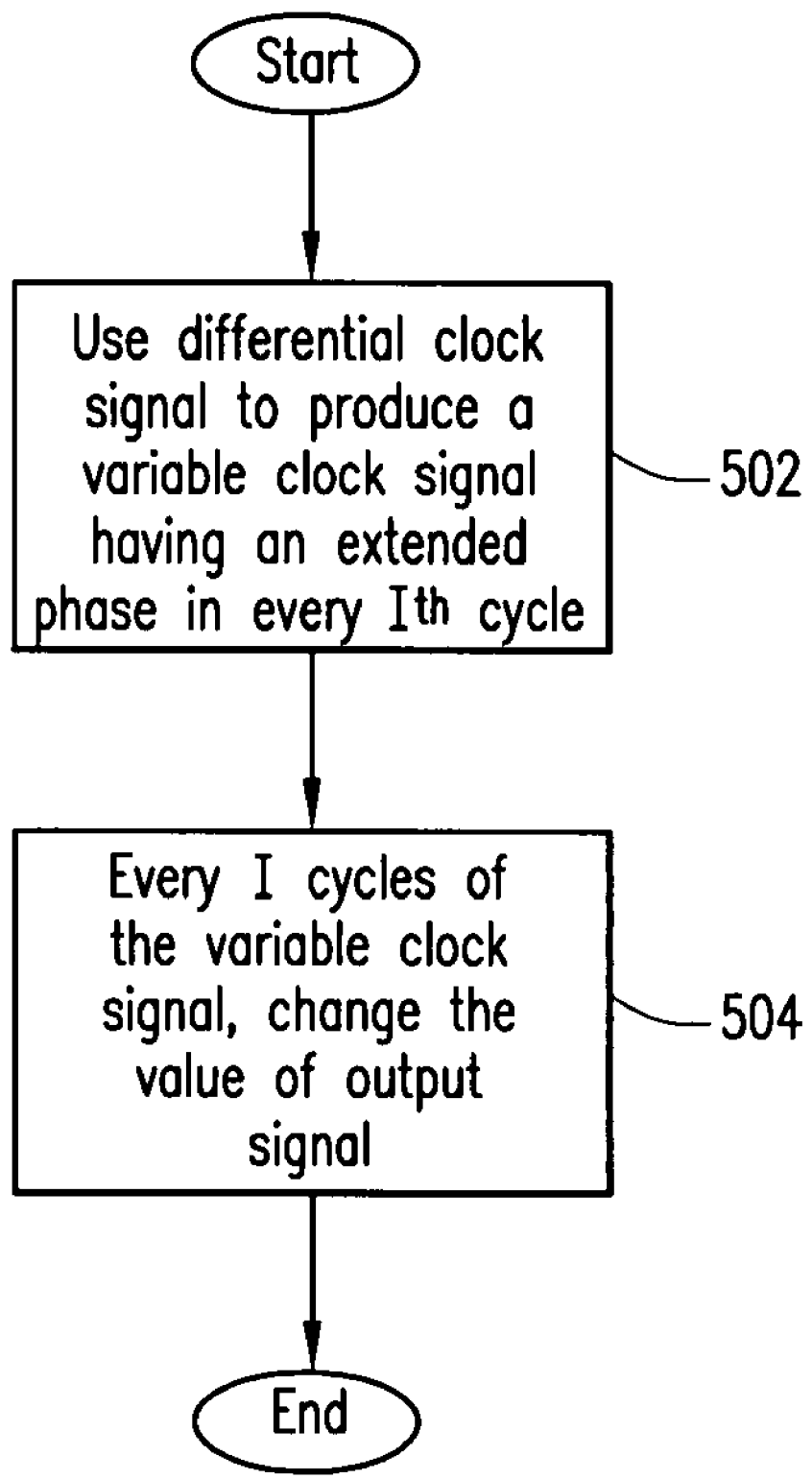
FIG. 5 is a flowchart associated with a method of generating a clock signal having a fifty percent duty cycle according to an embodiment of the present disclosure.

With reference now to FIG. 5, a scheme for generating a clock signal having a fifty percent duty cycle according to one embodiment of the disclosure is shown. In this embodiment, a differential clock signal is used to produce a variable clock signal having an extended phase in every $I^{th}$ cycle (block 502). To say this another way, in every $I^{th}$ cycle, the cycle lasts one and a half times as long as a normal cycle. The variable clock signal is then provided to an counter that is configured to divide by 2I to generate an output signal while maintaining a fifty percent duty cycle. Every I cycles of the variable clock signal, the value of the output signal is changed (block 504). Since the counter is counting to I and changing the clock signal while one of the I cycles of the input is extended, the counter is in actuality counting to I plus one-half. After the counter has counted to I twice, an entire cycle of the output signal has been created having a fifty percent duty cycle and a frequency that is the same as the frequency of the differential clock signal divided by (2I+1).

Based on the foregoing Detailed Description, it may be appreciated that the embodiments set forth herein provide a clock divider and method that can provide frequency division of a differential input signal by both odd and even numbers while maintaining a fifty percent duty cycle. Although the present patent disclosure has been described with reference to certain exemplary embodiments, it is to be understood that the forms of the embodiments shown and described are to be treated as illustrative only. Accordingly, various changes, substitutions and modifications can be realized without departing from the scope of the present disclosure as set forth in the following claims.

What is claimed is:

1. A clock divider for producing a signal having a fifty percent duty cycle, said clock divider comprising:
signal modifier circuitry operable to provide a variable clock signal, wherein said signal modifier circuitry modifies a differential clock signal that comprises first and second complementary clock signals, responsive to first and second control signals of said signal modifier circuitry having respective first values, to produce said variable clock signal, further wherein said variable clock signal contains an extended clock phase in every $I^{th}$ cycle, I being an integer; and counting circuitry for changing the value of an output signal each time I cycles of said variable clock signal are counted, while maintaining a fifty percent duty cycle.

2. The clock divider for producing a signal having a fifty percent duty cycle according to claim 1, wherein said signal modifier circuitry alternately uses said first complementary clock signal and said second complementary clock signal to produce an intermediate clock signal, said signal modifier circuitry operating responsive to said first control signal having said respective first value.

3. The clock divider for producing a signal having a fifty percent duty cycle according to claim 2, wherein said signal modifier circuitry ensures that during the phase in which a change is made between said first and second complementary clock signals, said variable clock signal held to VDD or GND for said phase duration, said signal modifier circuitry operating responsive to said second control signal having said respective first value.

4. The clock divider for producing a signal having a fifty percent duty cycle according to claim 1, wherein said signal modifier circuitry passes through one of said first and second complementary clock signals as said variable clock signal, said signal modifier circuitry operating responsive to said first and second control signals having respective second values.

5. The clock divider for producing a signal having a fifty percent duty cycle according to claim 4, wherein said output signal comprises a frequency that is equal to a frequency of said differential clock signal divided by 2I, said output signal being responsive to said first and second control signals having said respective second values.

6. The clock divider for producing a signal having a fifty percent duty cycle according to claim 1, wherein said output signal comprises a frequency that is equal to a frequency of said differential clock signal divided by (2I+1), said output signal being responsive to said first and second control signals having said respective first values.

7. The clock divider for producing a signal having a fifty percent duty cycle according to claim 1, wherein said variable clock signal and said output signal each comprise complementary clock signals.

8. A clock divider for producing a signal having a fifty percent duty cycle, said clock divider comprising:
   means for providing a variable clock signal, wherein in a first mode, said means for providing said variable clock signal modifies two complementary clock signals to create said variable clock signal, said variable clock signal having a phase in every $I^{th}$ cycle that is extended for a clock cycle, I being an integer;
   means for changing the value of an output signal each time I cycles of said variable clock signal are counted; and
   means for producing first and second control signals used by said means for providing said variable clock signal.

9. The clock divider for producing a signal having a fifty percent duty cycle according to claim 8, wherein said means for providing said variable clock signal alternately uses each of said two complementary clock signals to produce an intermediate clock signal.

10. The clock divider for producing a signal having a fifty percent duty cycle according to claim 8, wherein said means for producing said first and second control signals is operable responsive to said output signal.

11. The clock divider for producing a signal having a fifty percent duty cycle according to claim 8, wherein said means for providing a variable clock signal comprises a first multiplexer selected by said first control signal and a second multiplexer selected by said second control signal.

12. The clock divider for producing a signal having a fifty percent duty cycle according to claim 8, wherein said means for producing said first and second control signals comprises a D-flip-flop, an inverter, and XOR gates at least operatively connected to receive said variable clock signal.

13. The clock divider for producing a signal having a fifty percent duty cycle according to claim 8, wherein in a second mode, said means for providing said variable clock signal passes through one of said complementary clock signals as said variable clock signal.

14. The clock divider for producing a signal having a fifty percent duty cycle according to claim 13, wherein said first mode provides division of said differential clock signal by an odd number and said second mode provides division of said differential clock signal by an even number.

15. A method of generating a clock signal having a fifty percent duty cycle, said method comprising:
   using a differential clock signal to provide a variable clock signal, wherein using said differential clock signal in a first mode comprises modifying said differential clock signal that comprises first and second complementary clock signals to produce said variable clock signal, further wherein said variable clock signal contains an extended clock phase in every $I^{th}$ cycle, I being an integer; and
   changing the value of an output signal each time I cycles of said variable clock signal is counted.

16. The method of generating a clock signal having a fifty percent duty cycle according to claim 15, wherein using said differential clock signal to provide said variable clock signal comprises, in said first mode, alternately using said first complementary clock signal and said second complementary clock signal to produce an intermediate clock signal.

17. The method of generating a clock signal having a fifty percent duty cycle according to claim 16, wherein using said differential clock signal to provide said variable clock signal further comprises, in said first mode, ensuring that a phase of said variable clock signal is held to one of VDD and GND for a predetermined phase duration.

18. The method of generating a clock signal having a fifty percent duty cycle according to claim 15, wherein using said differential clock signal to provide said variable clock signal comprises, in a second mode, passing through one of said first and second complementary clock signals as said variable clock signal.

19. The method of generating a clock signal having a fifty percent duty cycle according to claim 18, wherein in said second mode, the frequency of said output signal is equal to the frequency of said differential clock signal divided by 2I.

20. The method of generating a clock signal having a fifty percent duty cycle according to claim 18, wherein in said first mode, the frequency of said output signal is equal to the frequency of said differential clock signal divided by (2I+1).

* * * * *